United States Patent [19]
Kuo

[11] Patent Number: 5,471,498
[45] Date of Patent: Nov. 28, 1995

[54] HIGH-SPEED LOW-VOLTAGE DIFFERENTIAL SWING TRANSMISSION LINE TRANSCEIVER

[75] Inventor: James R. Kuo, Cupertino, Calif.

[73] Assignee: National Semiconductor Corporation, Santa Clara, Calif.

[21] Appl. No.: 47,731

[22] Filed: Apr. 15, 1993

[51] Int. Cl.[6] ............................. H04L 27/04; H04L 1/02; H03K 9/00; H03F 3/04
[52] U.S. Cl. ........................ 375/295; 375/296; 375/316; 330/310
[58] Field of Search ............................. 375/7, 8, 36, 59, 375/60, 75; 330/310, 242, 252, 256; 307/491, 281

[56] References Cited

U.S. PATENT DOCUMENTS

| | | | |
|---|---|---|---|
| 3,899,754 | 8/1975 | Brolin | 375/32 |
| 4,630,284 | 12/1986 | Cooperman | 375/36 |
| 5,111,080 | 5/1992 | Mizukami et al. | |
| 5,144,405 | 9/1992 | Naber | 357/51 |
| 5,287,386 | 2/1994 | Wade | 375/36 |

FOREIGN PATENT DOCUMENTS

| | | |
|---|---|---|
| 60-075121 | 9/1985 | Japan . |
| WO/A8503817 | 8/1985 | WIPO . |
| WO/A9217938 | 10/1992 | WIPO . |

OTHER PUBLICATIONS

IBM Technical Disclosure Bulletin, "Single-ended Receiver with Orthogonal Only Outputs", vol. 35, No. 1B, Jun. 1992, New York, US, pp. 199–201.

*Primary Examiner*—Sandra L. O'Shea
*Assistant Examiner*—John Ning
*Attorney, Agent, or Firm*—H. Donald Nelson; David E. Steuber; Vincenzo D. Pitruzzella

[57] ABSTRACT

A data transceiver includes a transmitter connected at one end of a data transmission line and a receiver connected at the other end of the data transmission line. At least some portions of the transceiver are formed in CMOS. A temperature compensation circuit is connected to selected components of the transceiver to correct for temperature-induced variations in currents through those components. The temperature compensation circuit includes a pair of transistors connected, respectively, in parallel conduction paths. The respective width-to-length ratios of the channels of the transistors are unequal, and their gates are tied together. The current through the larger transistor varies directly with temperature, and this current is reflected in a current mirror transistor that is connected to the shorted gates of the transistor pair. Since in CMOS technology current varies inversely with temperature, the current through the mirror transistor can be used as a means of providing temperature compensation for selected components of the transceiver.

29 Claims, 6 Drawing Sheets

HIGH-SPEED LOW-VOLTAGE DIFFERENTIAL SWING TRANSMISSION LINE TRANSCEIVER

FIELD OF THE INVENTION

This invention relates to transceivers for delivering data to, and receiving data from, a transmission line, and in particular to transceivers for use in conjunction with a high-speed low-voltage differential swing transmission line.

BACKGROUND OF THE INVENTION

Data transmission lines or buses are used to transfer data between the components of computers and other digital data systems. While the components of a computer, for example, generally handle data in a "single-ended" form, i e , a single conductor is either "high" or "low", differential swing transmission lines are typically used to transmit data between the CPU and other components of the computer. The reason is that single-ended lines are susceptible to common mode noise, while a differential swing, two-wire line is not. In a differential swing system, the data are represented by the voltage differential between two lines (e.g., +V and −V), and this differential remains the same when both lines are subjected to outside influences.

This requires that a transmitter be provided at the input to a transmission line to convert the data from single-ended to differential form, and that a receiver be provided at the output of the transmission line to convert the data from differential to single-ended form. The transmitter/receiver pair at the input and output of the line are referred to in combination as a transceiver.

The transmitter must receive the single-ended input data and convert it into differential pulses with minimal skew, i.e., the corresponding rise and fall on the transmission line pair must occur at the same time. The receiver must receive the differential input and generate symmetrical output pulses. Particular problems are encountered when the devices are formed in CMOS, since the characteristics of CMOS devices vary with temperature. Thus temperature changes can cause the data on the transmission line to be skewed, and this can affect the symmetry of the single-ended output of the receiver.

SUMMARY OF THE INVENTION

In a transceiver according to this invention, the transmitter includes a pair of conduction paths into which the single-ended input data are directed. Each of the parallel paths contains a selected number of inverters and transmission gates such that the respective signals at the outputs of the data paths are in an inverse relationship, i.e., one of them reflects the input and the other is the opposite of the input. The output of each of the parallel paths is connected to transistor switches, preferably formed in CMOS, which are connected in such a way that a current flows in a first direction through a termination resistor when a "1" appears at the input, and in the opposite direction when a "0" appears at the input. The two sides of the differential transmission line are connected to the respective terminals of the termination resistor.

The receiver includes a pair of transistors connected in parallel and supplied in common by a current source. The wires of the transmission line are connected to the control terminals of these two transistors, respectively, such that one of the transistors is switched on when the other transistor is switched off. A voltage is sensed at a point in one of the parallel conduction paths, and is delivered through one or more inverters to the output of the receiver.

A temperature compensation circuit is connected to various points in the transceiver where compensation for the temperature-dependent characteristics of CMOS devices is required. In a preferred embodiment, the temperature compensation circuit includes a pair of unmatched transistors with their gates tied together and connected in parallel conduction paths. The current through the larger transistor varies directly with temperature changes. This current is mirrored to locations in the transceiver where temperature compensation is required. Typically, this is done by connecting the current mirror transistor in series with a CMOS transistor. Since the current through the current mirror transistor varies directly with temperature (i.e., opposite to the normal temperature-current relationship in CMOS devices,), the current mirror transistor counteracts temperature-induced changes in the current through the other transistor.

The transceiver may be connected to a unidirectional transmission line such as the QuickRing transmission line developed by Beta Phase, as well as bidirectional transmission lines or buses. In the latter case, a transmitter and a receiver are connected at each end of the transmission line, and a means is provided for disabling one of the transmitters when the other transmitter is sending data onto the line.

DESCRIPTION OF THE INVENTION

Figure 1A:
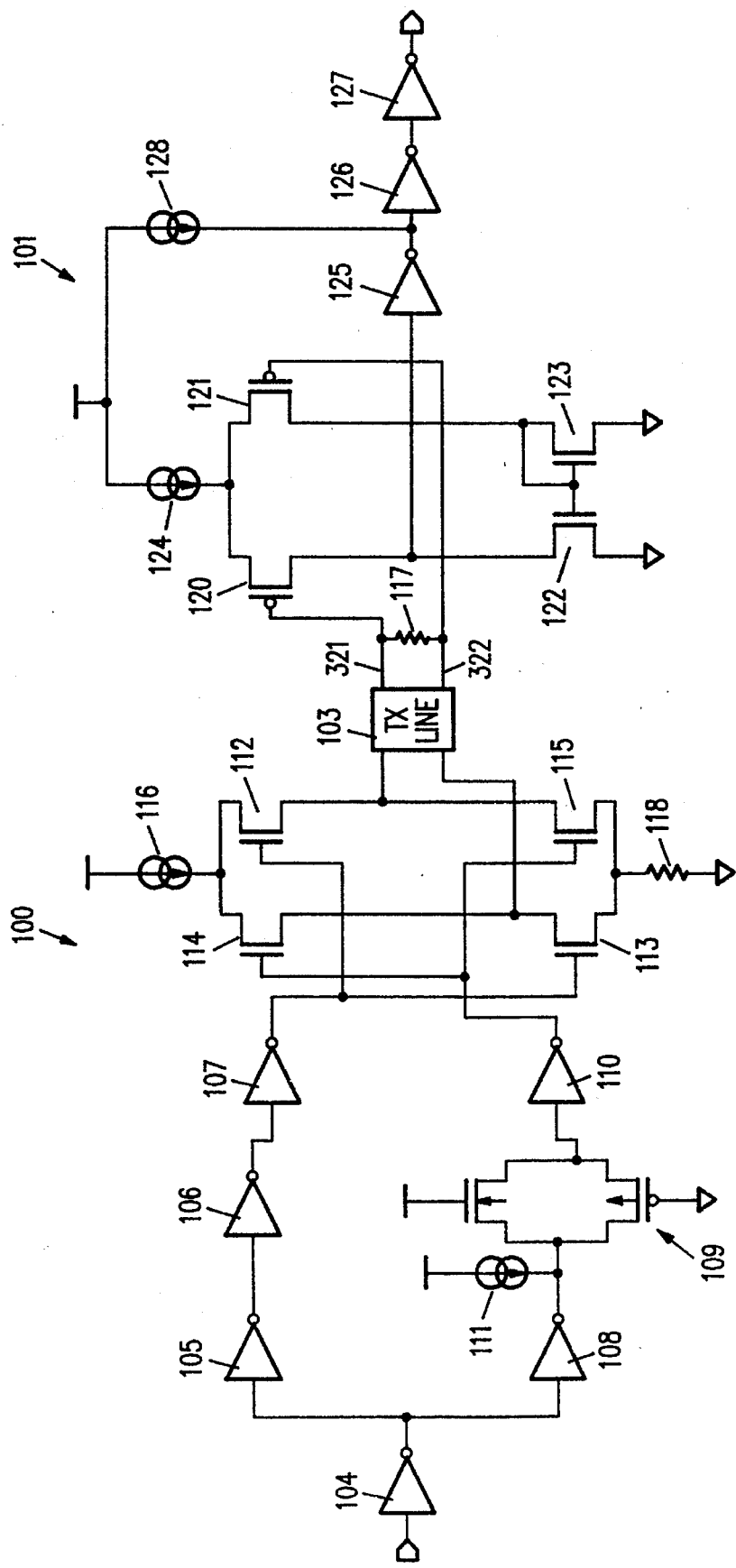
FIG. 1A illustrates a transceiver for use with a unidirectional transmission line, such as QuickRing.
Figure 2:
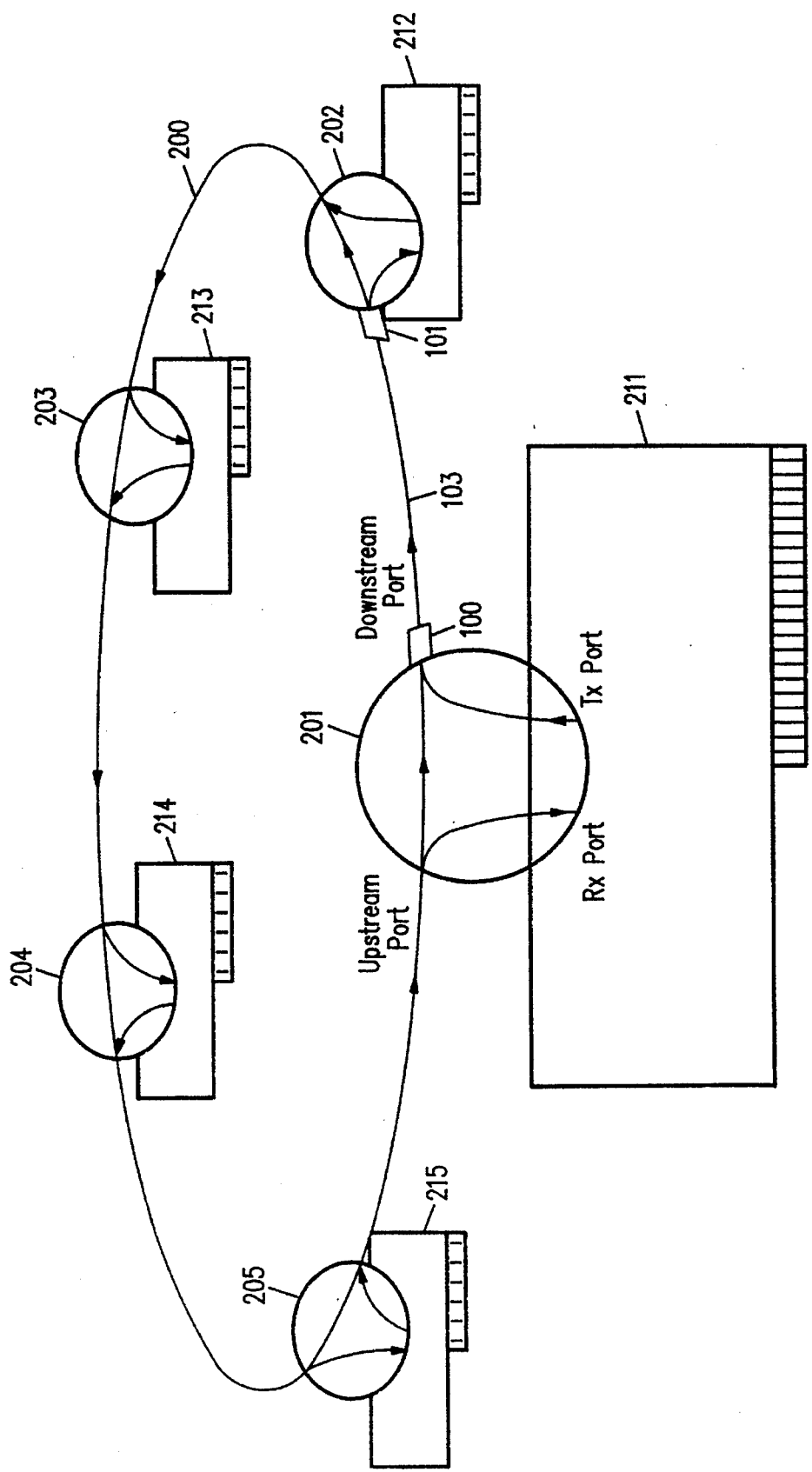
FIG. 2 illustrates a schematic view of the QuickRing data transmission line.

FIG. 1A illustrates a transmitter 100 and a receiver 101 which are connected to the ends of a transmission line 103. Transmission line 103 could be a segment of a QuickRing unidirectional data transmission system such as is illustrated in FIG. 2. In FIG. 2, each of controllers 201–205 is connected to a respective one of digital devices 211–215, and the data circulates in one direction around the loop 200. This means in effect that transmitter 100 may transmit at all times and no means for disabling transmitter 100 need be provided.

Transmitter 100 includes an inverter 104 which serves as a buffer and feeds into two parallel data paths. One of the paths contains an inverter 105, an inverter 106 and a inverter 107. The other parallel conductive path contains an inverter 108, a transmission gate 109, and a inverter 110. A temperature-compensated current source 111 supplies current at the output of inverter 108 and the input of transmission gate 109.

The output of inverter 107 is connected in common to the gates of NMOS transistors 112 and 113; and the output of inverter 110 is connected in common to the gates of NMOS transistors 114 and 115. The drains of transistors 112 and 114 are connected to a temperature-compensated current source 116, and the sources of transistors 113 and 115 and connected through a resistor 118 to ground. Transistors 112–115 are also coupled to a termination resistor 117, which is at the other end of transmission line 103. Transmission line 103 includes wires 321 and 322.

Figure 3:
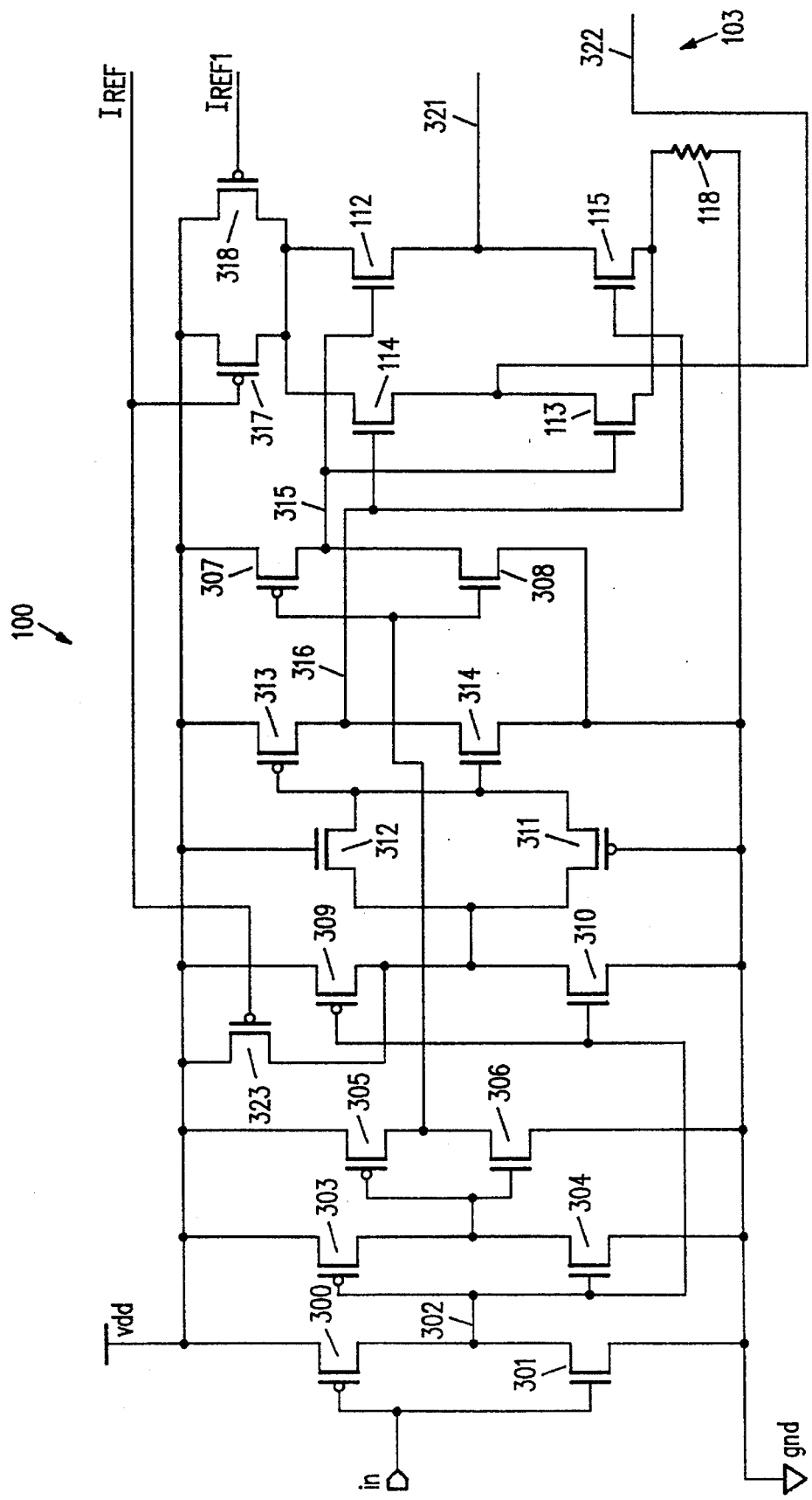
FIG. 3 illustrates a circuit diagram of the transmitter.

FIG. 3 illustrates a circuit diagram of transmitter 100. Inverter 104 includes a PMOS transistor 300 and an NMOS transistor 301, the inverted output appearing on a line 302. Inverter 105 includes a PMOS transistor 303 and an NMOS transistor 304, inverter 106 includes a PMOS transistor 305 and an NMOS transistor 306, and inverter 107 includes a PMOS transistor 307 and an NMOS transistor 308. This completes the upper parallel conduction path shown in FIG. 1A. Referring to the lower parallel conduction path, inverter 108 includes a PMOS transistor 309 and an N-channel transistor 310, transmission gate 109 includes a PMOS transistor 311 and an NMOS transistor 312, and inverter 110 includes a PMOS transistor 313 and an NMOS transistor 314. Transmission gate 311 and each of these inverters is of conventional CMOS structure, well known to those skilled in the art. A PMOS transistor 323, included in temperature-compensated current source 111, is connected in common to the drains of transistors 309 and 310.

From this discussion, it is apparent that the output of inverter 107, which appears on a line 315, is of opposite polarity to the output of inverter 110, which appears on a line 316. The output of inverter 107 is directed to the respective gates of NMOS transistors 112 and 113, which are the same as the similarly numbered transistors in FIG. 1A. Similarly, the output of inverter 110 is directed to the respective gates of NMOS transistors 114 and 115. Since the signals on lines 315 and 316 are of opposite polarity, transistors 112 and 113 are turned on when transistors 114 and 115 are turned off, and vice versa.

Transistors 112–115 are supplied by a current which flows through transistors 317 and 318. (The operation of transistors 317 and 318, which are part of temperature-compensated current source 116, will be described below.) When transistors 112 and 113 are turned on (transistors 114 and 115 being turned off), a current flows through transistor 112, over wire 321, through termination resistor 117 (FIG. 4), over wire 322, and through transistor 113 and resistor 118 to ground. Thus when transistors 112 and 113 are turned on, the signal on wire 321 is high and the signal on wire 322 is low.

Conversely, when transistors 114 and 115 are turned on (transistors 112 and 113 being turned off), a current flows through transistor 114, over wire 322, through termination resistor 117, over wire 321, and through transistor 115 and resistor 118 to ground. In this situation, the signal on wire 322 is high and the signal on wire 321 is low. Thus wires 321 and 322 (which together form transmission line 103) register a differential output in response to the single-ended input to inverter 104. That is, the binary signal at the input to inverter 104 determines which pair of transistors 112/113 and 114/115 is turned on, and this in turn determines the polarity of the signal across termination resistor 117. The output of termination resistor 117 represents the differential swing signal delivered by transmission line 103.

Referring again to FIG. 1A, receiver 101 contains a pair of PMOS transistors 120 and 121 connected in parallel conduction paths between a reference voltage and ground. Wire 321 is connected to the gate of transistor 120, and wire 322 is connected to the gate of transistor 121. Also connected in the parallel conduction paths are an NMOS transistor 122 and an NMOS transistor 123, whose gates are tied together. The gate and drain of transistor 123 are shorted so that transistor 122 and 123 operate as a current mirror. The parallel conduction paths are supplied by a temperature-compensated current source 124. An output is taken from the node between transistors 120 and 122 and delivered to the input of a series of inverters 125, 126 and 127. A temperature-compensated current source 128 supplies a current to the input of inverter 125. The single-ended output of receiver 101 appears at the output of inverter 127 and is delivered to a component of the computer or other system.

Figure 4:
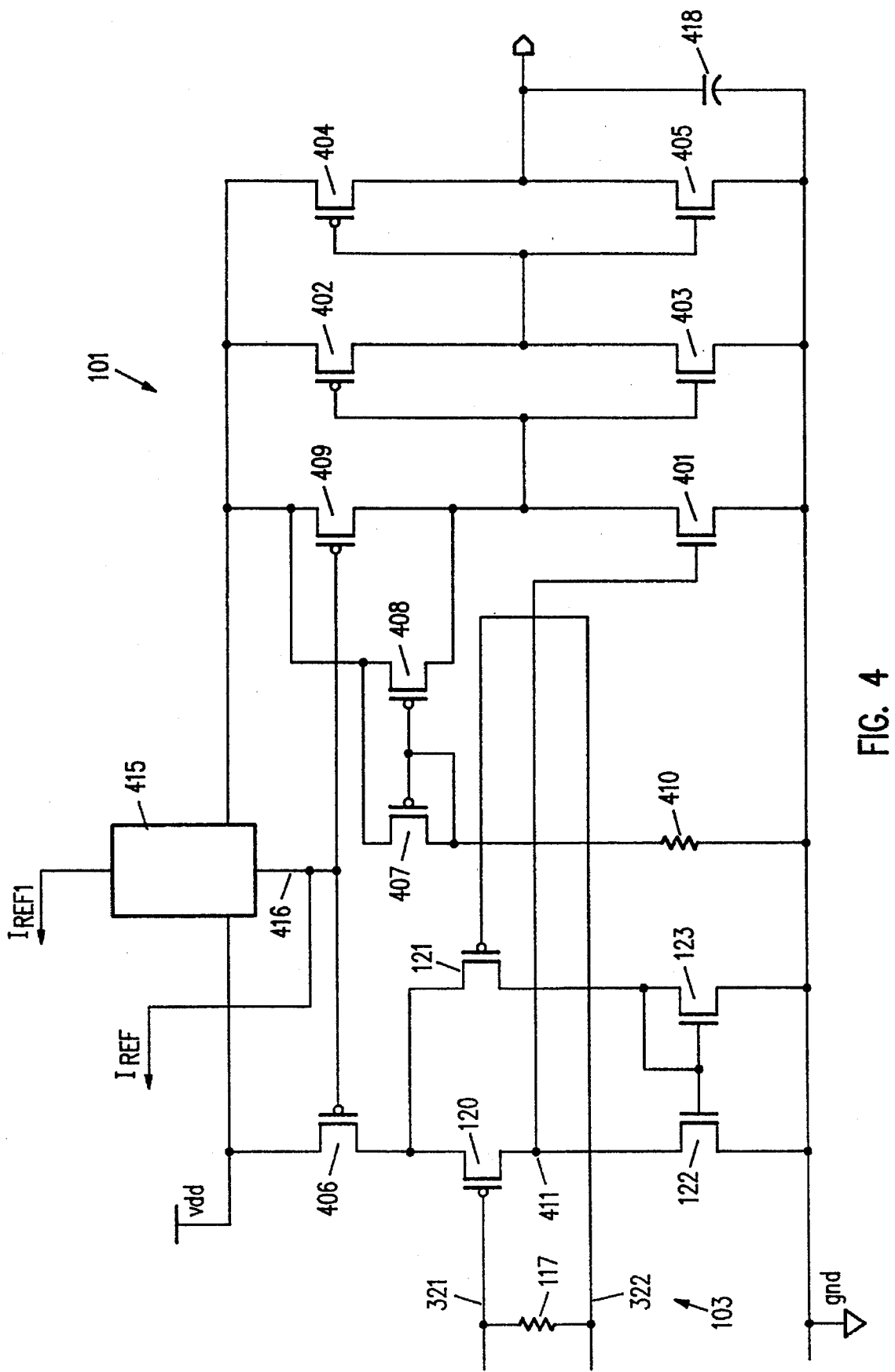
FIG. 4 illustrates a circuit diagram of the receiver.

A circuit diagram of receiver 101 is illustrated in FIG. 4. Inverter 125 contains an NMOS transistor 401; inverter 126 contains a pair of CMOS transistors 402 and 403; and inverter 127 contains a pair of CMOS transistors 404 and 405. A capacitor 418 at the output of inverter 127 represents the parasitic impedance of the component (not shown) which receives the output of receiver 101. Temperature-compensated current source 124 contains a PMOS transistor 406, and temperature-compensated current source 128 contains PMOS transistors 407, 408 and 409. A resistor 410 is connected between transistor 407 and ground. Transistors 120 and 122 are joined at a node 411.

The signal on wire 321 is received at the gate of PMOS transistor 120, which is turned off if the signal is high and on if the signal is low. Similarly, PMOS transistor 121 is controlled by the signal on line 322. When the signal on wire 321 is high, transistor 120 is off and transistor 121 is on. Therefore, the voltage at node 411 is low, and this voltage is delivered to the gate of NMOS transistor 401, turning that transistor off and creating a high voltage at the input to inverter 126. Therefore, the output of inverter 127 is also high. Inverters 126 and 127 are conventional CMOS inverters well known to those skilled in the art. The function of inverters 125–127 is to shape and amplify the signal appearing at node 411 in order to produce a sharply defined, symmetrical signal at the output of receiver 101. The pair of transistors 122 and 123 operate as a current mirror to equalize the currents through transistors 120 and 121. This has the effect of doubling the output current at node 411 in response to changes of the differential input on wires 321 and 322.

Conversely, when the signal on wire 321 is low, transistor 120 is turned on, transistor 121 is turned off, and the voltage at node 411 is high. As a result, NMOS transistor 401 is turned on and the input to inverter 126 is low. In this situation, NMOS transistor 405 will be turned on, grounding the output of receiver 101. Thus the output of receiver 101 is single-ended, varying between $V_{dd}$ and ground.

As mentioned previously, the characteristics of CMOS devices vary with temperature. In particular, their transconductance decreases with increasing temperature. Thus, unless temperature-compensation is provided, the current through a CMOS device will decrease as the temperature increases.

Referring again to FIG. 4, a temperature compensation unit 415 generates a reference signal which is used to compensate for the temperature dependence of certain of the transistors in transmitter 100 and receiver 101, namely those transistors which have a high gain and are therefore particularly vulnerable to variations in temperature. In this embodiment, temperature-compensation is applied to transistors 112–115 and transistor 310 in transmitter 100 (FIG. 3), and transistors 120 and 401 in receiver 101 (FIG. 4).

Figure 5:
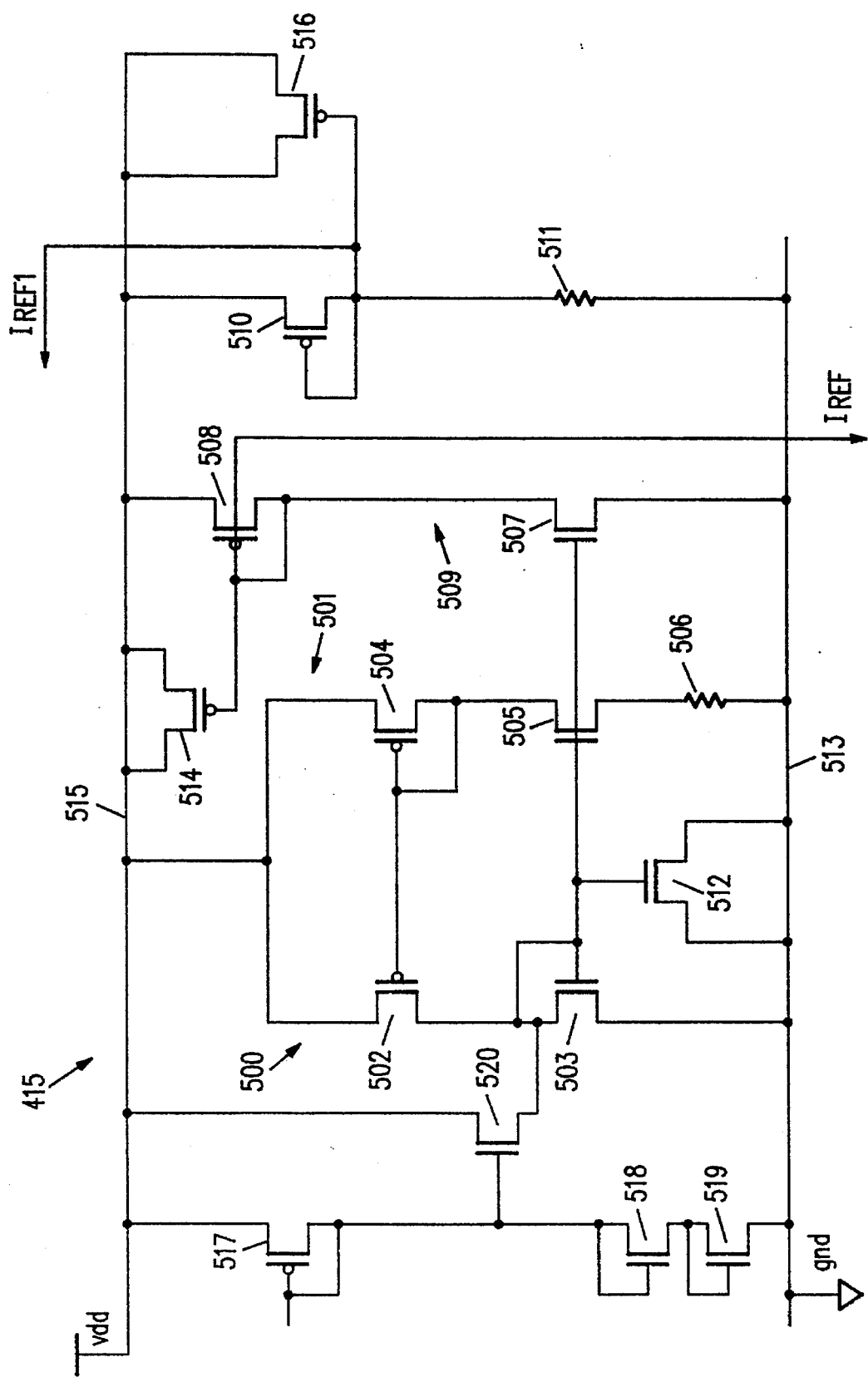
FIG. 5 illustrates a circuit diagram of the temperature compensation circuit.

FIG. 5 illustrates a circuit diagram of temperature-compensation unit 415. A pair of conduction paths 500 and 501 are connected between a reference voltage $V_{dd}$ and ground.

A PMOS transistor 502 and an NMOS transistor 503 are connected in conduction path 500. A PMOS transistor 504, NMOS transistor 505, and a resistor 506 are connected in conduction path 501, the gate and drain of transistor 504 being shorted. Transistors 502 and 504 are a matched pair and provide a current mirror for currents in conduction paths 500 and 501.

The width-to-length ratio of the channel of transistor 505 is substantially larger than the width-to-length ratio of the channel of transistor 503. Therefore, the gate-to-source voltage ($V_{GS}$) of transistor 503 is greater than the gate-to-source voltage of transistor 505. Since the gates of transistors 503 and 505 are tied together, the following relationships hold:

$$V_{GS}(503) = V_{GS}(505) + V_R(506)$$

$$V_{GS}(503) - V_{GS}(505) = V_R(506)$$

where $V_{GS}(503)$ is the gate-to-source voltage of transistor 503, $V_{GS}(505)$ is the gate-to-source voltage of transistor 505, and $V_R(506)$ is the voltage across resistor 506. As the temperature increases, the quantity ($V_{GS}(503) - V_{GS}(505)$) increases, and therefore $V_R(506)$ also increases. This means that the current flowing through resistor 506 also increases. Thus the current in conduction path 501 (which is the same as the current through resistor 506) increases with increasing temperature, which means that it varies inversely to the normal variation of currents through a CMOS transistor.

An NMOS transistor 507 and a PMOS transistor 508 are connected in a conduction path 509 between $V_{dd}$ and ground. The gate of transistor 507 is coupled to the gates of transistors 503 and 505. Transistor 507 therefore acts a current mirror for the current flowing in conduction path 501. The voltage at the gate of transistor 508 varies in proportion to the current flowing through conduction path 509. This voltage, constitutes an output of temperature compensation unit 415 and is designated $I_{REF}$. The current flowing through conduction path 509 is typically much larger than the current flowing in conduction path 501 (e.g., milliamps rather than microamps). The values of transistors 507 and 508 are established so as to obtain the correct $I_{REF}$ for temperature compensation purposes, as described below.

A second output of temperature-compensation unit 415, designated $I_{REF}1$ is taken at the drain of a transistor 510 which is connected in series with a resistor 511 between $V_{dd}$ and ground. The gate and drain of transistor 510 are shorted together. Since transistor 510 is not temperature-compensated, the output $I_{REF}1$ varies inversely with temperature, as with a normal CMOS device.

An NMOS transistor 512 is connected between the common gate terminals of transistors 503,505 and 507, and acts as a capacitor to filter out any noise which might appear on the ground line (designated 513). Similarly, a PMOS transistor 514 is connected between the gate of transistor 508 and the $V_{dd}$ voltage supply line (designated 515), and a PMOS transistor 516 is connected between the drain of transistor 510 and voltage supply line 515. Transistors 514 and 516 filter out any noise that occurs on voltage supply line 515, and prevent it from appearing in the output signals $I_{REF}$ and $I_{REF}1$, respectively.

Transistors 517–520 form a start-up circuit for temperature-compensation unit 415. A PMOS transistor 517 and two NMOS transistors 518 and 519 are connected in series between $V_{dd}$ and ground. The drain and gate terminals of these transistors are tied together, and they together form a voltage divider, the voltage at the common node between transistors 517 and 518 being applied to the gate of NMOS transistor 520. When the transceiver is first turned on, transistor 520 is conductive and couples the drain of transistor 503 to $V_{dd}$. This starts a current flowing through transistor 503, which in turn causes a current to flow in transistor 505. Transistors 518 and 519 clamp the gate of transistor 520, and transistor 520 turns off when current is flowing in conduction paths 500 and 501 and the circuit is operating.

In summary, temperature-compensation unit 415 produces two voltage outputs, a first voltage output $I_{REF}$ Which varies directly with temperature and a second voltage output $I_{REF}1$ which varies inversely with temperature.

Referring once again to FIG. 4, $I_{REF}$ appears on a line 416 and is delivered to the gates of transistors 406 and 409. Considering transistor 406 first, since $I_{REF}$ varies directly with temperature, it causes the current through transistor 406 likewise to vary directly with temperature, and this compensates for the temperature-induced effects in transistors 120 and 121. In other words, as the temperature increases, the transconductance of transistors 120 and 121 decreases, and this would reduce the current flowing through these transistors. The current through transistor 406 increases with temperature, however, and this balances the current reduction and maintains relatively temperature-independent currents flowing in transistors 120 and 121. By means of a simulation program such as SPICE, the width-to-length ratios of the channel of transistors 503 and 505, and the sizes of transistors 507, 508 and 406 are set so as to provide proper temperature compensation for transistors 120 and 121.

Similarly, $I_{REF}$ is applied to the gate of transistor 409, which is connected in series with transistor 401. The current through transistor 409 compensates for temperature-induced variations in the current through transistor 401. The paired transistors 407 and 408 act as a current mirror and reduce the magnitude of the compensation applied to transistor 401. This ensures that the rise time of the pulses transmitted by transistor 401 remains the same, regardless of temperature. The fall time of these pulses is determined by the voltage at the gate of transistor 401 and this in turn is determined by the currents flowing through transistors 120 and 121. The temperature compensation provided by transistor 406 ensures that the fall time of the pulses transmitted by transistor 401 remains the same. Thus the temperature compensation provided by transistor 406 (for transistors 120 and 121) and the combined effect of transistors 407–409 (for transistor 401) operate together to ensure that the pulses produced by transistor 401 are symmetrical.

Referring again to FIG. 3, the $I_{REF}$ output of temperature-compensation unit 415 is directed to the gates of transistors 317 and 323. As noted above, transistor 323 represents temperature-compensated current source 111 in FIG. 1A. Transistor 323 is connected in parallel with transistor 309 and in series with transistor 310 between the supply voltage $V_{dd}$ and ground. Transistors 309 and 310 are included in inverter 108 (FIG. 1A). The current through transistor 323 varies directly with temperature and temperature-compensates the current flowing through transistor 310. This ensures that the rise time of the current through transistor 310 is consistent.

Transistor 317 is connected in parallel with transistor 318, and together these two transistors form current source 116 (FIG. 1). $I_{REF}$ is applied to the gate of transistor 317, and $I_{REF}1$ is applied to the gate of transistor 318. As noted above, $I_{REF}1$ varies inversely with temperature which compensates both for variations in temperature and fluctuations in $V_{dd}$. Transistor 317 provides a current which varies directly with temperature and therefore compensates for the normal CMOS temperature-induced effects of the currents through transistor pairs 112/113 and 114/115. The combination of transistors 317 and 318 provide compensation for fluctuations in $V_{dd}$ and temperature.

Referring to FIG. 1A, temperature-compensated current sources 111, 116, 124 and 128 can be viewed as performing the following functions.

Current source 111. Current source 111 (transistors 323 and 309) regulates the rise time of the output of inverter 108 to provide a symmetrical input to transmission gate 109.

Current source 116. Current source 116 (transistors 317 and 318) provides temperature-compensated and $V_{dd}$-noise-independent currents for switching transistors 112/113 and 114/115. Operating in conjunction with resistor 118, the current produced by current source 116 provides a stable common mode voltage for the data pulses delivered to transmission line 103, and operating in conjunction with termination resistor 117, the current provides a stable differential voltage for the data pulses.

Current source 124. Current source 124 (transistor 406) provides a temperature-compensated current through transistors 120 and 121 and thereby stabilizes the gain of the input stage (transistors 120–123).

Current source 128. Current source 128 (transistors 407–409) provides a temperature-compensated current through transistor 401 and thereby stabilizes the rise time of the pulses generated by transistor 401 (inverter 125). Operating in conjunction with current source 121, current source 128 ensures that pulses generated by transistor 401 are symmetrical and stable.

Figure 1B:
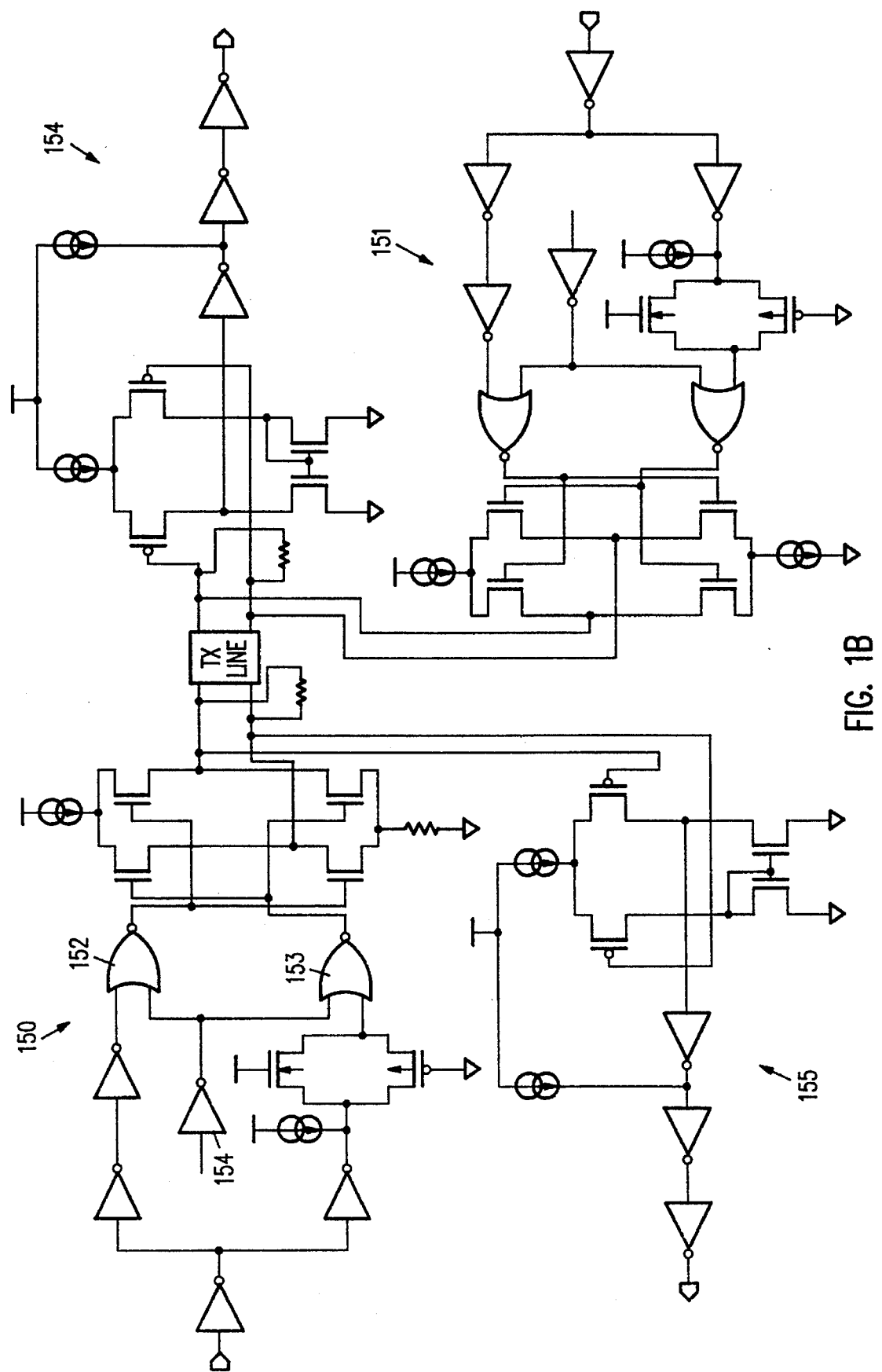
FIG. 1B illustrates a transceiver for use with a bidirectional transmission line or bus.

The transceiver of this invention is also applicable to a bi-directional data transmission line, as shown in FIG. 1B. Transmitter 150 is identical to transmitter 100 (FIG. 1A) except that a pair of NOR gates 152 and 153 have been substituted for inverters 107 and 110. An enable signal is applied through a buffer inverter 154 to one of the inputs of each of NOR gates 152 and 153. When the enable signal is high, the respective outputs of NOR gates 152 and 153 are frozen at zero and the transmitter is therefore disabled. Transmitter 151 is identical to transmitter 150. The enable signals applied to transmitters 150 and 151 are coordinated such that one of the transmitters is disabled when the other is delivering information to transmission line 103. Receivers 154 and 155 are identical to receiver 101 in FIG. 1A.

The foregoing embodiments are intended to be illustrative and not limiting. Many additional and alternative embodiments in accordance with this invention will be apparent to those skilled in the art. The full scope of this invention is defined only in the following claims.

I claim:

1. A data transmitter for converting single-ended digital data to differential data, said transmitter comprising:
   an input terminal;
   first and second parallel conduction paths;
   a first inverter connected in said first conduction path and a second inverter connected in said second conduction path, said second inverter being formed in CMOS;
   a temperature compensation unit connected to an output of said second inverter, said temperature compensation unit providing a current which increases with increasing temperature so as to regulate a rise time of pulses generated at said output of said second inverter; and
   a switching circuit connected to said first and second conduction paths, said switching circuit providing differential output data in response to single-ended input data at said input terminal.

2. The data transmitter of claim 1 wherein said first conduction path further comprises a third inverter and a fourth inverter, said first inverter being connected between said third and fourth inverters, and wherein said second conduction path further comprises a transmission gate and a fifth inverter, said transmission gate being connected between said second and fifth inverters.

3. The data transmitter of claim 1 wherein said switching circuit comprises first and second MOSFETs, the gates of said first and second MOSFETs being connected to said first conduction path, and third and fourth MOSFETs, the gates of said third and fourth MOSFETs being connected to said second conduction path, a node between said first and fourth MOSFETs being connected to a first wire of a differential data transmission line, and a node between said second and third MOSFETs being connected to a second wire of said differential data transmission line.

4. The data transmitter of claim 1 wherein said temperature compensation unit comprises third and fourth parallel conduction paths, a first MOSFET being connected in said third conduction path and a second MOSFET being connected in series with a resistor in said fourth conduction path, a width-to-length ratio of a channel of said first MOSFET being less than a width-to-length ratio of a channel of said second MOSFET, the gates of said first and second MOSFETs being connected together and connected to a current mirror MOSFET.

5. A data transmitter for converting single-ended digital data to differential data, said transmitter comprising:
   an input terminal;
   first and second parallel conduction paths;
   a first inverter connected in said first conduction path and a transmission gate connected in said second conduction path;
   a switching circuit connected to said first and second conduction paths, said switching circuit providing differential output data in response to single-ended input data at said input terminal; and
   a temperature compensation unit connected to said switching circuit, said temperature compensation unit providing a current which increases with increasing temperature so as to compensate for temperature-induced variations in a supply current in said switching circuit.

6. The data transmitter of claim 5 wherein said first conduction path further comprises a second inverter and a third inverter and wherein said second conduction path further comprises a fourth inverter and a fifth inverter, said transmission gate being connected between said fourth and fifth inverters.

7. The data transmitter of claim 5 wherein said switching circuit comprises first and second MOSFETs, the gates of said first and second MOSFETs being connected to said first conduction path, and third and fourth MOSFETs, the gates of said third and fourth MOSFETs being connected to said second conduction path, a node between said first and fourth MOSFETs being connected to a first wire of a differential data transmission line, and a node between said second and third MOSFETs being connected to a second wire of said differential data transmission line.

8. The data transmitter of claim 5 wherein said temperature compensation unit comprises third and fourth parallel conduction paths, a first MOSFET being connected in said third conduction path and a second MOSFET being connected in series with a resistor in said fourth conduction path, a width-to-length ratio of a channel of said first MOSFET being less than a width-to-length ratio of a channel of said second MOSFET, the gates of said first and second MOSFETs being connected together and connected to a current mirror MOSFET.

9. The data transmitter of claim 5 wherein said temperature compensation unit is connected to an output of said fourth inverter.

10. A receiver for converting differential data to single-ended data, said receiver comprising:
    an input stage terminal;
    an input stage comprising:
      first and second parallel conduction paths;
      a first MOSFET connected in said first conduction path and a second MOSFET connected in said second conduction path; and a pair of current mirror MOSFETs connected in said first and second conduction paths, respectively;

an inverter connected to a common node between said first MOSFET and the current mirror MOSFET in said first conduction path; and a temperature compensation unit connected to said input stage, said temperature compensation unit stabilizing a gain in said input stage.

11. The receiver of claim 10 further comprising a second and a third inverter connected in series with said first inverter.

12. The receiver of claim 10 wherein said temperature compensation unit comprises third and fourth parallel conduction paths, a third MOSFET being connected in said third conduction path and a fourth MOSFET being connected in series with a resistor in said fourth conduction path, a width-to-length ratio of a channel of said third MOSFET being less than a width-to-length ratio of a channel of said fourth MOSFET, the gates of said third and fourth MOSFETs being connected together and connected to a current mirror MOSFET.

13. A receiver for converting differential data to single-ended data, said receiver comprising:

an input terminal;

an input stage comprising:
first and second parallel conduction paths;
a first MOSFET connected in said first conduction path and a second MOSFET connected in said second conduction path; and
a pair of current mirror MOSFETs connected in said first and second conduction paths, respectively;

an inverter connected to a common node between said first MOSFET and the current mirror MOSFET in said first conduction path; and a temperature compensation unit connected to an output of said inverter, said temperature compensation unit providing a current which increases with increasing temperature so as to regulate a rise time of pulses generated at said output of said inverter.

14. The receiver of claim 13 further comprising a second and a third inverter connected in series with said first inverter.

15. The receiver of claim 13 wherein said temperature compensation unit comprises third and fourth parallel conduction paths, a third MOSFET being connected in said third conduction path and a fourth MOSFET being connected in series with a resistor in said fourth conduction path, a width-to-length ratio of a channel of said third MOSFET being less than a width-to-length ratio of said fourth MOSFET, the gates of said third and fourth MOSFETs being connected together and connected to a current mirror MOSFET.

16. A data transceiver combination comprising:

a differential swing data transmission line;

a data transmitter connected to a first end of said transmission line, said data transmitter comprising:
a first input terminal;
first and second parallel conduction paths;
a first inverter connected in said first conduction path and a second inverter connected in said second conduction path;
a temperature compensation unit connected to an output of said second inverter, said temperature compensation unit providing a current which increases with increasing temperature so as to regulate a rise time of pulses generated at said output of said second inverter; and a switching circuit connected to said first and second conduction paths, said switching circuit providing differential output data in response to single-ended input data at said first input terminal; and a receiver connected to a second end of said data transmission line.

17. A data transceiver combination comprising:

a differential swing data transmission line;

a data transmitter connected to a first end of said data transmission line, said data transmitter comprising:
a first input terminal;
first and second parallel conduction paths;
a first inverter connected in said first conduction path and a transmission gate connected in said second conduction path;
a switching circuit connected to said first and second conduction paths, said switching circuit providing differential output data in response to single-ended input data at said first input terminal; and
a temperature compensation unit connected to said switching circuit, said temperature compensation unit providing a current which increases with increasing temperature so as to compensate for temperature-induced variations in a supply current in said switching circuit; and a receiver connected to a second end of said data transmission line.

18. A data transceiver combination comprising:

a differential swing data transmission line;

a data transmitter connected at a first end of said data transmission line; and a data receiver connected to a second end of said data transmission line, said data receiver comprising:
an input terminal;
an input stage comprising:
first and second parallel conduction paths;
a first MOSFET connected in said first conduction path and a second MOSFET connected in said second conduction path; and
a pair of current mirror MOSFETs connected in said first and second conduction paths, respectively;
an inverter connected to a common node between said first MOSFET and the current mirror MOSFET in said first conduction path; and
a temperature compensation unit connected to said input stage, said temperature compensation unit stabilizing a gain in said input stage.

19. A data transceiver combination comprising:

a data transmission line;

a data transmitter connected to a first end of said data transmission line; and a data receiver connected at a second end of said data transmission line, said data receiver comprising:
an input terminal;
an input stage comprising:
first and second parallel conduction paths;
a first MOSFET connected in said first conduction path and a second MOSFET connected in said second conduction path; and
a pair of current mirror MOSFETs connected in said first and second conduction paths, respectively;
an inverter connected to a common node between said first MOSFET and the current mirror MOSFET in said first conduction path; and a temperature compensation unit connected to an output of said inverter, said temperature compensation unit providing a current which increases with increasing temperature so as to regulate a rise time of pulses generated at said output of said inverter.

20. The data transmitter of claim 3 wherein the source of said first MOSFET and the source of said third MOSFET share a common node.

21. The data transmitter of claim 3 wherein the drain of said second MOSFET and the drain of said fourth MOSFET share a common node.

22. The data transmitter of claim 7 wherein the source of said first MOSFET and the source of said third MOSFET share a common node.

23. The data transmitter of claim 7 wherein the drain of said second MOSFET and the drain of said fourth MOSFET share a common node.

24. The data transmitter of claim 21 wherein said common node is connected to ground through a resistor.

25. The data transmitter of claim 23 wherein said common node is connected to ground through a resistor.

26. The data transmitter of claim 1 wherein said temperature compensation circuit is connected to said output of said second inverter through a pair of current mirror MOSFETs.

27. The data transmitter of claim 5 wherein said temperature compensation circuit is connected to said switching circuit through a pair of current mirror MOSFETs.

28. The data receiver of claim 10 wherein said temperature compensation circuit is connected to said input stage through a pair of current mirror MOSFETS.

29. The data receiver of claim 13 wherein said temperature compensation circuit is connected to said output of said inverter through a pair of current mirror MOSFETS.

* * * * *

UNITED STATES PATENT AND TRADEMARK OFFICE
CERTIFICATE OF CORRECTION

PATENT NO. : 5,471,498
DATED : November 28, 1995
INVENTOR(S) : James R. Kuo

It is certified that error appears in the above-indentified patent and that said Letters Patent is hereby corrected as shown below:

```
    Column 5, line 32, after "acts" insert --as--.

Column 7, line 48, delete ", said second inverter being
formed in CMOS".
```

Signed and Sealed this

Twentieth Day of August, 1996

*Attest:*

BRUCE LEHMAN

*Attesting Officer*  *Commissioner of Patents and Trademarks*